United States Patent
Kim et al.

(10) Patent No.: US 9,812,367 B2
(45) Date of Patent: Nov. 7, 2017

(54) METHOD FOR FABRICATING SEMICONDUCTOR DEVICE INCLUDING REPLACEMENT PROCESS OF FORMING AT LEAST ONE METAL GATE STRUCTURE

(71) Applicants: Ju-Youn Kim, Suwon-si (KR); Ji-Hwan An, Seoul (KR); Kwang-Yul Lee, Suwon-si (KR); Tae-Won Ha, Seongnam-si (KR); Jeong-Nam Han, Seoul (KR)

(72) Inventors: Ju-Youn Kim, Suwon-si (KR); Ji-Hwan An, Seoul (KR); Kwang-Yul Lee, Suwon-si (KR); Tae-Won Ha, Seongnam-si (KR); Jeong-Nam Han, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 70 days.

(21) Appl. No.: 14/621,440

(22) Filed: Feb. 13, 2015

(65) Prior Publication Data
US 2015/0357426 A1    Dec. 10, 2015

(30) Foreign Application Priority Data
Jun. 10, 2014  (KR) .................. 10-2014-0070148

(51) Int. Cl.
*H01L 21/8234*   (2006.01)
*H01L 29/66*     (2006.01)
(Continued)

(52) U.S. Cl.
CPC .. *H01L 21/82345* (2013.01); *H01L 21/28185* (2013.01); *H01L 21/823431* (2013.01);
(Continued)

(58) Field of Classification Search
CPC ......... H01L 21/82345; H01L 21/28185; H01L 21/823431; H01L 21/823828;
(Continued)

(56) References Cited

U.S. PATENT DOCUMENTS 6,068,830 A   5/2000  Diamandis et al.
6,181,394 B1  1/2001  Sanelle et al.
(Continued)

*Primary Examiner* — Laura Menz
*Assistant Examiner* — Candice Y Chan
(74) *Attorney, Agent, or Firm* — Volentine & Whitt, PLLC

(57) ABSTRACT

A method of fabricating a semiconductor device includes forming an inter-metal dielectric layer including a first trench and a second trench which are spaced from each other on a substrate, forming a first dielectric layer along the sides and bottom of the first trench, forming a second dielectric layer along the sides and bottom of the second trench, forming first and second lower conductive layers on the first and second dielectric layers, respectively, forming first and second capping layers on the first and second lower conductive layer, respectively, performing a heat treatment after the first and second capping layers have been formed, removing the first and second capping layers and the first and second lower conductive layers after performing the heat treatment, and forming first and second metal gate structures on the first and second dielectric layers, respectively.

19 Claims, 22 Drawing Sheets

(51) Int. Cl.
*H01L 29/51* (2006.01)
*H01L 21/28* (2006.01)
*H01L 29/49* (2006.01)
*H01L 21/311* (2006.01)
*H01L 21/3213* (2006.01)

(52) U.S. Cl.
CPC .......... *H01L 29/513* (2013.01); *H01L 29/517* (2013.01); *H01L 29/66545* (2013.01); *H01L 29/66795* (2013.01); *H01L 21/28088* (2013.01); *H01L 21/31138* (2013.01); *H01L 21/32139* (2013.01); *H01L 29/4966* (2013.01)

(58) Field of Classification Search
CPC ........... H01L 21/823842; H01L 29/513; H01L 29/517; H01L 29/66545; H01L 29/66795
See application file for complete search history.

(56) References Cited

U.S. PATENT DOCUMENTS

| | | |
|---|---|---|
| 6,361,584 B1 | 3/2002 | Stevens et al. |
| 6,410,137 B1 | 6/2002 | Bunyan |
| 6,476,415 B1 | 11/2002 | Walker et al. |
| 6,602,597 B1 | 8/2003 | Kerr, III |
| 6,696,677 B2 | 2/2004 | Kennedy |
| 6,933,991 B2 | 8/2005 | Sanelle et al. |
| 6,956,739 B2 | 10/2005 | Bunyan |
| 7,126,199 B2 | 10/2006 | Doczy et al. |
| 7,763,098 B2 | 7/2010 | Alizadeh-Khiavi et al. |
| 7,871,915 B2 | 1/2011 | Lim et al. |
| 7,919,820 B2 | 4/2011 | Chung et al. |
| 8,009,262 B2 | 8/2011 | Dunn |
| 8,017,825 B2 | 9/2011 | Kuznicki et al. |
| 8,597,995 B2 | 12/2013 | Xu |
| 2004/0018557 A1 | 1/2004 | Qu et al. |
| 2004/0043030 A1 | 3/2004 | Griffiths et al. |
| 2006/0140858 A1 | 6/2006 | Goldenberg et al. |
| 2007/0248537 A1 | 10/2007 | Yang et al. |
| 2008/0280087 A1 | 11/2008 | Wu |
| 2008/0316381 A1 | 12/2008 | Wu |
| 2009/0061451 A1 | 3/2009 | Achim et al. |
| 2009/0274649 A1 | 11/2009 | Qu et al. |
| 2009/0304803 A1 | 12/2009 | Hasan |
| 2010/0263529 A1 | 10/2010 | Alban et al. |
| 2011/0114538 A1 | 5/2011 | Cosyns et al. |
| 2011/0206917 A1 | 8/2011 | Niimi et al. |
| 2011/0229703 A1 | 9/2011 | Hayata et al. |
| 2011/0250146 A1 | 10/2011 | Zhang et al. |
| 2011/0284866 A1 | 11/2011 | Tran et al. |
| 2012/0028434 A1* | 2/2012 | Lee .......................... G03F 7/40 438/400 |
| 2012/0280288 A1 | 11/2012 | Ando et al. |
| 2013/0026579 A1* | 1/2013 | Lu ....................... H01L 27/1104 257/369 |
| 2013/0056836 A1 | 3/2013 | Yu et al. |
| 2013/0087837 A1* | 4/2013 | Chang ................. H01L 29/4966 257/288 |
| 2013/0103281 A1 | 4/2013 | Daniels |
| 2013/0137779 A1 | 5/2013 | Wimmer et al. |
| 2013/0224632 A1 | 8/2013 | Roumi |
| 2013/0260549 A1 | 10/2013 | Jagannathan et al. |
| 2013/0299914 A1 | 11/2013 | Kim |
| 2013/0337656 A1 | 12/2013 | Chambers et al. |
| 2014/0001570 A1 | 1/2014 | Brodsky et al. |

* cited by examiner

METHOD FOR FABRICATING SEMICONDUCTOR DEVICE INCLUDING REPLACEMENT PROCESS OF FORMING AT LEAST ONE METAL GATE STRUCTURE

PRIORITY STATEMENT

This application claims priority from Korean Patent Application No. 10-2014-0070148 filed on Jun. 10, 2014 in the Korean Intellectual Property Office, and all the benefits accruing therefrom under 35 U.S.C. 119, the contents of which are hereby incorporated by reference in their entirety.

BACKGROUND

1. Field of the Inventive Concept

The present inventive concept relates to a method of fabricating a semiconductor device.

2. Description of the Related Art

Recently, a metal gate is frequently being used instead of a polysilicon gate to improve characteristics of a semiconductor device. The metal gate may be fabricated by a replacement metal gate process. A typical replacement metal gate process includes carrying out etching, deposition, and polishing operations.

SUMMARY

According to an aspect of the inventive concept, there is provided a method of fabricating a semiconductor device, which includes forming an inter-metal dielectric layer having a first trench and a second trench which are spaced from each other, on a substrate, whereby each of the trenches has sides and a bottom, forming a first dielectric layer along the sides and bottom of the first trench, forming a second dielectric layer along the sides and bottom of the second trench, forming a first lower conductive layer and a second lower conductive layer respectively on the first dielectric layer and the second dielectric layer, forming a first capping layer and a second capping layer respectively on the first lower conductive layer and the second lower conductive layer, performing a heat treatment after the first and second capping layers have been formed, removing the first and second capping layers and the first and second lower conductive layers after performing the heat treatment, and forming first and second metal gate structures respectively on the first and second dielectric layers.

In accordance with another aspect of the present inventive concept, there is provided a method of fabricating a semiconductor device, which includes forming an inter-metal dielectric layer including a trench on a substrate, whereby the trench has sides and a bottom, forming a dielectric layer along the sides and bottom of the trench, forming a lower conductive layer and a capping silicon layer sequentially on the dielectric layer, performing a heat treatment after the capping silicon layer has been formed, removing the lower conductive layer and the capping silicon layer after performing the heat treatment, and forming a metal gate structure including a P-type work function adjustment pattern and an N-type work function adjustment pattern on the dielectric layer.

In accordance with still another aspect of the present inventive concept, there is provided a method of fabricating a semiconductor device, which includes forming an inter-metal dielectric layer having a first trench and a second trench which are spaced from each other, on a substrate, whereby each of the trenches has sides and a bottom, forming a first dielectric layer along the sides and bottom of the first trench, forming a second dielectric layer along the sides and bottom of the second trench, forming first and second metal gate structures respectively on the first and second dielectric layers, and in which the forming of the first metal gate structure comprises forming a first TiN layer to a first thickness on the first dielectric layer, and forming a first N-type work function adjustment layer directly on the first TiN layer, and in which the forming of the second metal gate structure comprises forming a second TiN layer to a second thickness, different from the first thickness, on the second dielectric layer, forming a third TiN layer to a third thickness, different from the second thickness, directly on the second TiN layer, and forming a second N-type work function adjustment layer on the third TiN layer.

In accordance with still another aspect of the present inventive concept, there is provided a method of fabricating a semiconductor device, which begins with the forming of a structure that includes a semiconductor substrate, an interlayer dielectric layer on the substrate, and an interface layer of a silicon oxide on the semiconductor substrate, and wherein the structure has at least one trench passing through the interlayer dielectric layer, whereby each said at least one trench has sides and a bottom, and the interface layer is disposed on the semiconductor substrate at the bottom of the at least one trench. Subsequently, a high-k dielectric layer is conformally formed on the structure such that the high-k dielectric layer extends along surfaces which define the sides of each said at least one trench and along the interface layer, and a conductive layer is conformally formed on the high-k dielectric layer such that the conductive layer also extends along surfaces which define the sides of each said at least one trench and along the interface layer. Then the conductive layer and the interface layer are covered by forming capping material on the conductive layer. Next, the structure is heat treated and subsequent to the heat treatment the capping material and the conductive layer are removed. Subsequently, at least one work function adjustment pattern, and a metal gate electrode are formed in each trench.

BRIEF DESCRIPTION OF THE DRAWINGS

The above and other features and advantages of the present inventive concept will become more apparent with reference to the detailed description of preferred embodiments that follows as made with reference to the attached drawings in which.

DETAILED DESCRIPTION OF THE PREFERRED EMBODIMENTS

Figure 1:
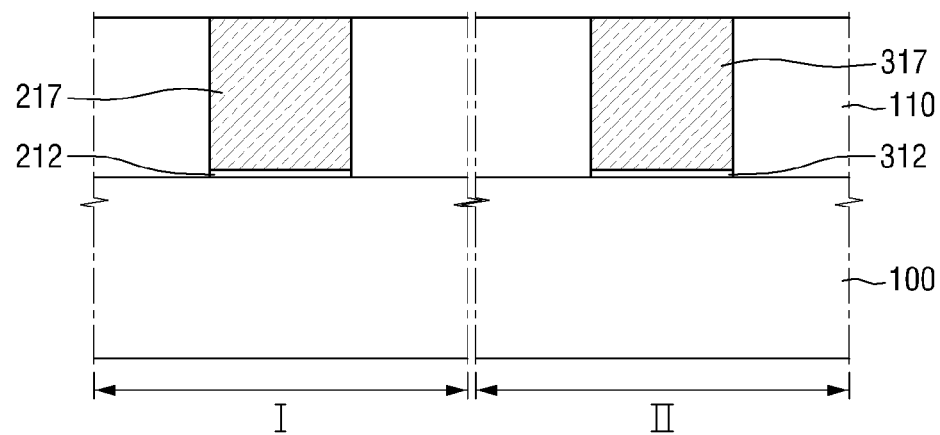
FIGS. 1, 2, 3, 4, 5, 6, 7, 8 and 9 are each a cross-sectional view of a semiconductor device during the course of its manufacture, and together illustrate a first embodiment of a method of fabricating a semiconductor device according to the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be Furthermore understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", extending "along", "connected to" or "coupled to" another element or layer, it can be directly on, extend directly on, be directly connected or coupled to the other element or layer or intervening elements or layers may be present. In contrast, when an element is referred to as being "directly on", extending "directly along", or as being "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be Furthermore understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a first embodiment of a method of fabricating a semiconductor device according to the present inventive concept will be described with reference to FIGS. 1 to 9. Note, though, in FIGS. 1 to 9, a source/drain region, a device isolation layer such as a shallow trench isolation (STI), and a sacrificial gate sidewall are not illustrated for the sake of simplicity.

Referring to FIG. 1, a substrate 100 may include a first region I and a second region II. The first region I and the second region II may be spaced from each other or may border each other.

The first region I may be an NMOS region and the second region II may be a PMOS region.

The substrate 100 may be a bulk silicon or silicon-on-insulator (SOI). The substrate 100 may be a pure silicon substrate or may comprise other materials such as germanium, silicon germanium, indium antimonide, a lead-tellurium compound, indium arsenic, indium phosphide, gallium arsenide, and gallium antimonide, but the substrate is not limited to these examples.

A first dummy gate dielectric layer 212 and a first dummy gate 217 are formed on the first region I of the substrate 100. A second dummy gate dielectric layer 312 and a second dummy gate 317 are formed on the second region II of the substrate 100. The first dummy gate dielectric layer 212 is disposed between the substrate 100 and the first dummy gate 217, and the second dummy gate dielectric layer 312 is disposed between the substrate and the second dummy gate 317.

For example, the first dummy gate dielectric layer 212 and the second dummy gate dielectric layer 312 may be formed of one of a silicon oxide (e.g., $SiO_2$), silicon oxynitride (SiON) and a combination thereof. The first dummy gate dielectric layer 212 and the second dummy gate dielectric layer 312 may be formed using a heat treatment, chemical material treatment, atomic layer deposition (ALD) or chemical vapor deposition (CVD) process.

The first dummy gate 217 and the second dummy gate 317 may comprise silicon. More specifically, the first dummy gate 217 and the second dummy gate 317 may comprise one of polycrystalline silicon (poly Si), amorphous silicon (a-Si), and a combination thereof. Both the first dummy gate 217 and the second dummy gate 317 may undoped or may be doped with similar impurities. Furthermore, one of the first dummy gate 217 and the second dummy gate 317 may be doped and the other may be undoped. Furthermore, one may be doped with n-type impurities (e.g., arsenic or phosphorous), and the other may be doped with p-type impurities (e.g., boron).

Subsequently, after forming the first dummy gate 217 and the second dummy gate 317, the source/drain region is formed in the substrate 100 adjacent the first dummy date 217 and the second dummy gate 317, respectively.

Subsequently, an inter-metal dielectric layer 110 which covers the first dummy gate 217 and the second dummy gate 317 is formed on the substrate 100. For example, the inter-metal dielectric layer 110 may comprise at least one of a low-k material, an oxide layer, a nitride layer, and an oxynitride layer. The low-k material may be a Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PRTEOS), Fluoride Silicate Glass (FSG), High Density Plasma (HDP), Plasma Enhanced Oxide (PEOX), Flowable CVD (FCVD), or a combination thereof, but the present embodiment is not limited to these examples.

Subsequently, the inter-metal dielectric layer 110 is planarized so that the upper surfaces of the first dummy gate 217 and the second dummy gate 317 are exposed. For example, the planarization process may include a chemical mechanical polishing (CMP) process.

Figure 2:
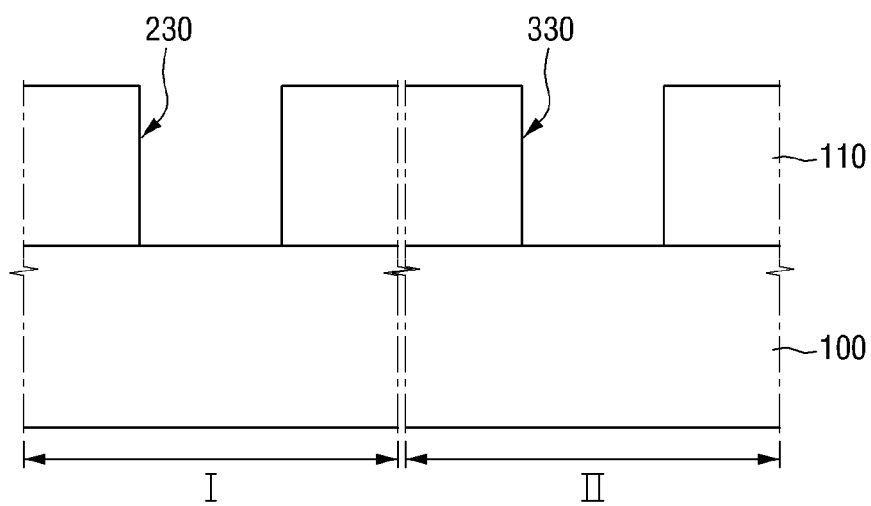

Referring to FIG. 2, the first dummy gate 217 and the second dummy gate 317 are removed. As a result, the first trench 230 and the second trench 230 are formed. The upper layer of the substrate 100 may be exposed by the first trench 230 and the second trench 330.

In other words, the inter-metal dielectric layer 110 including the first trench 230 and the second trench 330 is formed on the substrate 100. The first trench 230 is formed on the first region I and the second trench 330 is formed on the second region II. In an example of this embodiment of a method of fabricating the semiconductor according to the present inventive concept, the first trench 230 is formed on the NMOS region and the second trench 330 is formed on the PMOS region.

The first dummy gate 217 and the second dummy gate 317 may be removed by a wet process or a dry process. Specifically, in the case of the wet etching, the first dummy gate 217 and the second dummy gate 317 may be substantially removed by exposing the first dummy gate 217 and the second dummy gate 317 to an aqueous solution comprising a hydroxide source at an appropriate temperature for a sufficient amount of time. The hydroxide source may be a source of ammonium hydroxide or tetraalkyl ammonium hydroxide, for example, tetramethyl ammonium hydroxide (TMAH), but the embodiment is not limited thereto.

The first dummy gate dielectric layer 212 and the second dummy gate dielectric layer 312 may be removed by wet etching, dry etching, and a combination thereof. It is obvious that an etchant or an etching gas may be selected according to the material of the first dummy gate dielectric layer 212 and the second dummy gate dielectric layer 312.

Figure 3:
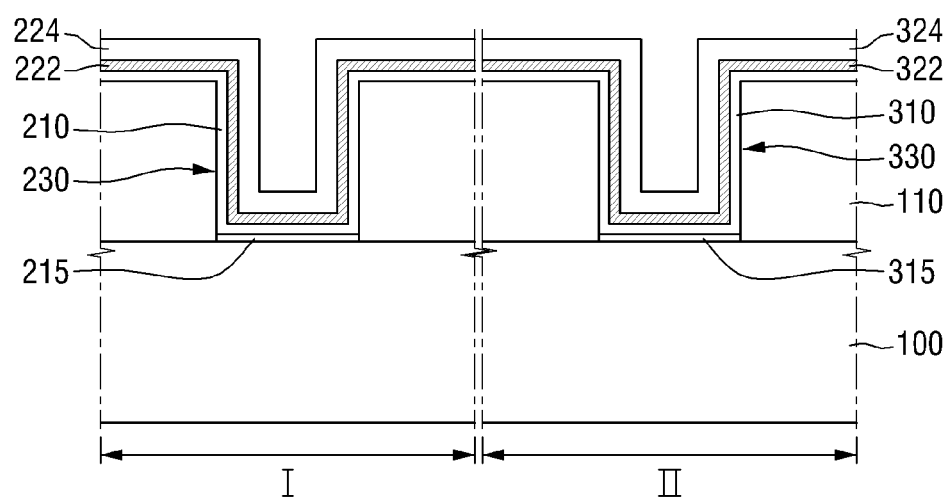

Referring to FIG. 3, a first interface layer 215 and a second interface layer 315 are formed on the floor of the first trench 230 and the floor of the second trench 330, respectively.

The first interface layer 215 and the second interface layer 315 may comprise a silicon oxide layer. The first interface layer 215 and the second interface layer 315 may be formed by using a chemical oxidation method, an ultraviolet ray oxidation method, a dual plasma oxidation method, or the like.

The first dielectric layer 210 is conformally formed on the upper surface of the inter-metal dielectric layer 110 and on the sides and bottom of the first trench 230. Furthermore, the second dielectric layer 310 is conformally formed on the upper surface of the inter-metal dielectric layer 110 and on the sides and bottom of the second trench 330 along with the first dielectric layer 210. Specifically, the first dielectric layer 210 and the second dielectric layer 310 are respectively formed on the first interface layer 215 and the second interface layer 315.

The first dielectric layer 210 and the second dielectric layer 310 are simultaneously formed by a chemical vapor deposition (CVD) or atomic layer deposition (ALD) process. The first dielectric layer 210 and the second dielectric layer 310 may comprise a high-k dielectric (insulating) material, e.g., at least one material selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the embodiment is not limited these examples.

Subsequently, a first lower conductive layer 222 and a second lower conductive layer 322 are formed on the first dielectric layer 210 and the second dielectric layer 310. The first lower conductive layer 222 and the second lower conductive layer 322 may be conformally formed along the first dielectric layer 210 and the second dielectric layer 310 by a chemical vapor deposition method or atomic layer deposition method, or like method. The first lower conductive layer 222 and the second lower conductive layer 322 may be simultaneously formed and, for example, may comprise a TiN layer. The first lower conductive layer 222 and the second lower conductive layer 322 may prevent the reaction between the first dielectric layer 210 and the first capping layer 224 and the reaction between the second dielectric layer 310 and the second capping layer 324 when performing a heat treatment which will be described later.

Subsequently, a first capping layer 224 and a second capping layer 324 are respectively formed on the first lower conductive layer 222 and the second lower conductive layer 322. After forming the first capping layer 224 and the second capping layer 324, heat treatment may be performed.

For example, the first capping layer 224 and the second capping layer 324 may comprise amorphous silicon, polysilicon, and a combination thereof. The first capping layer 224 and the second capping layer 324 may prevent the increase of the thickness of the first interface layer 215 and the second interface layer 315 while the heat treatment is performed.

Figure 4:
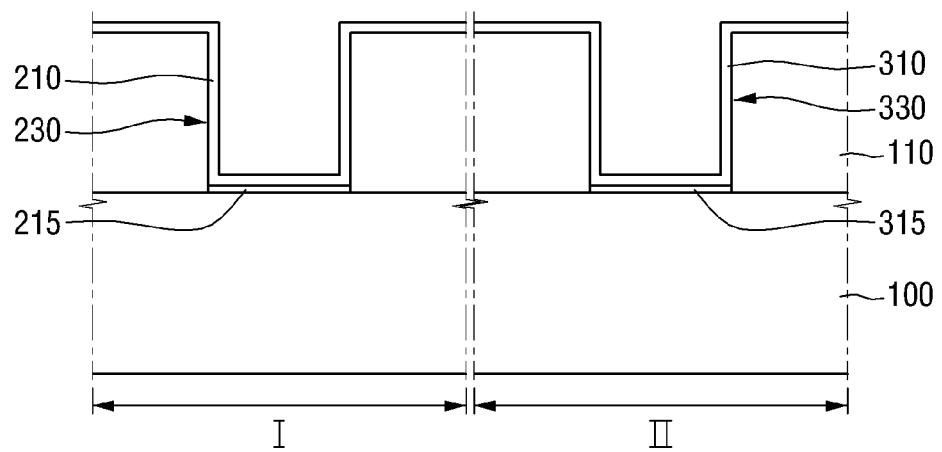

Referring to FIG. 4, after performing the heat treatment, the first capping layer 224 and the second capping layer 324 may be removed. Subsequently, the first lower conductive layer 222 and the second conductive layer 322 are removed so that the first dielectric layer 210 and the second dielectric layer 310 may be exposed.

Removing the first capping layer 224 and the second capping layer 324 and removing the first lower conductive layer 222 and the second lower conductive layer 322 may be simultaneously performed through the same process or may be individually performed through separate processes.

Removing the first lower conductive layer 222 and the second lower conductive layer 322 as well as the first capping layer 224 and the second capping layer 324 facilitates the subsequent forming of uniform layers on the structure. That is, if a metal gate structure were instead formed directly on the first lower conductive layer and the second conductive layer having a nonuniform surface after heat treatment, it would be difficult to form a metal gate structure which is uniform and has target characteristics.

Through the process of FIGS. 5 to 9, a first metal gate structure 291 is formed within the first trench 230 on the first dielectric layer 210, and a second metal gate structure 391 is formed within the second trench 330 on the second dielectric layer 310.

Figure 5:
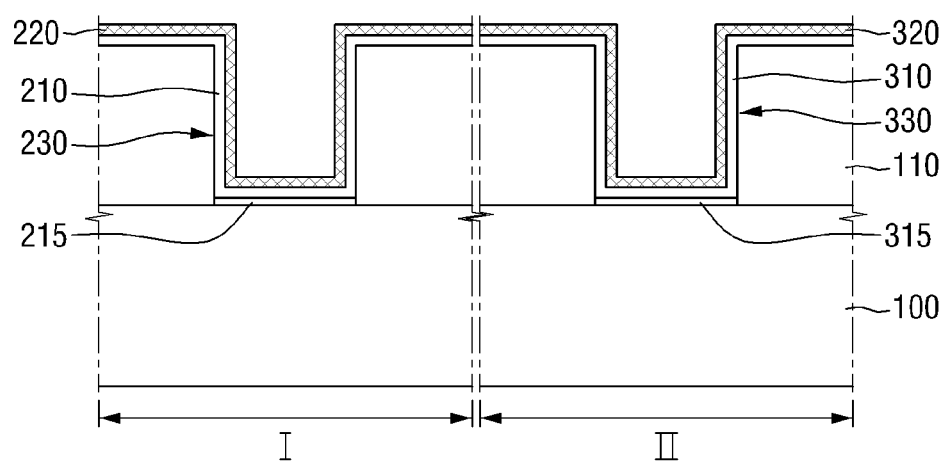

Specifically, referring to FIG. 5, a first work function adjustment layer 220 is formed along the sides and the bottom of the first trench 230, and a second work function adjustment layer 320 is formed along the sides and the bottom of the second trench 330.

The first work function adjustment layer 220 is formed on the upper surface of the inter-metal dielectric layer 110 and the sides and bottom of the first trench 230, and the second work function adjustment layer 320 is simultaneously formed on the upper surface of the inter-metal dielectric layer 110 and the sides and bottom of the second trench 330. The first work function adjustment layer 220 and the second work function adjustment layer 320 are conformally formed along the first dielectric layer 210 and the second dielectric layer 310, respectively. As an exemplary range, the thickness of the first work function adjustment layer 220 and the second work function adjustment layer 320 are each between about 1 Å and about 40 Å.

The first work function adjustment layer 220 and the second work function adjustment layer 320 may be p-type work function adjustment layers. For example, the first work function adjustment layer 220 and the second work function adjustment layer 320 may comprise a TiN layer. Furthermore, the first work function adjustment layer 220 and the second work function adjustment layer 320 may comprise a dual layer composed of a TaN layer and a TiN layer.

Figure 6:
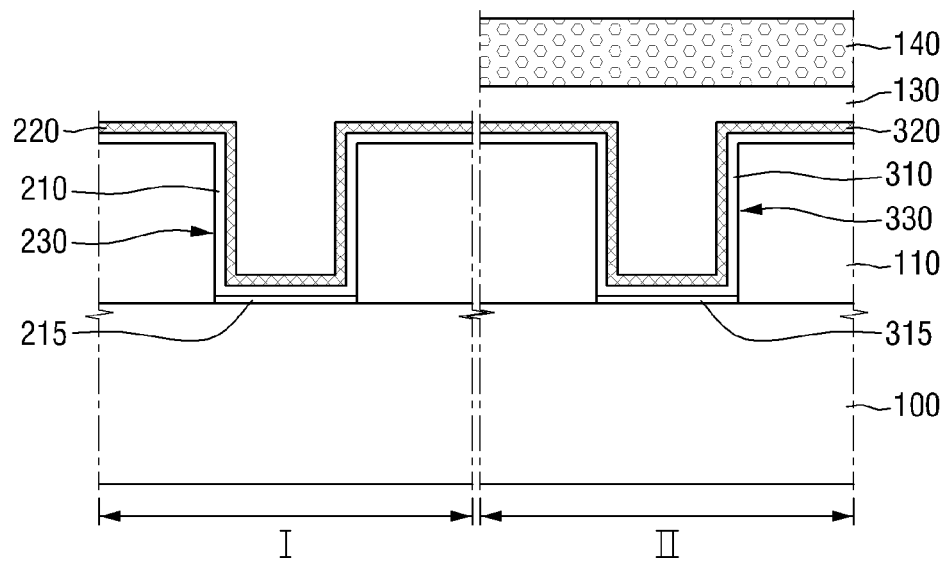

Referring to FIG. 6, a mask pattern 130 and a photoresist pattern 140 which exposes the first work function adjustment layer 220, but covers the second work function adjustment layer 230, are formed.

Specifically, a mask layer buried in the first trench 230 and the second trench 330 is formed on the first work function adjustment layer 220 and the second adjustment layer 320. The mask layer may also be formed on the upper surface of the inter-metal dielectric layer 110. The mask layer may be a bottom anti-reflective coating (BARC) layer. Furthermore, the mask layer may comprise materials having good gap-fill characteristics in order to better fill the first trench 230 and the second trench 330. The mask layer buried in the first trench 230 and the second trench 330 may contact the first work function adjustment layer 220 and the second work function adjustment layer 320.

Subsequently, a photoresist layer pattern 140 is formed on the mask layer. The photoresist pattern 140 exposes the mask layer on the first work function adjustment layer 220, but the photoresist pattern 140 covers the mask layer on the second work function adjustment layer 320. That is, the photoresist pattern 140 covers the second region II and exposes the first region I. Furthermore, the photoresist pattern 140 overlies the second work function adjustment layer 320 and does not overlie the first work function adjustment layer 220.

Subsequently, that part of the mask layer buried in the first trench 230 is removed using the photoresist pattern 140 as the mask of an etching process. The mask pattern 130 is formed on the second work function adjustment layer 320 through the etching process. The mask pattern 130 is buried in the second trench 330 and may be BARC pattern.

In other words, in the first region I, the mask pattern 130 is formed by removing the mask layer from atop the first work function adjustment layer 220 using an etching process. The first work function adjustment layer 220 is exposed by the mask pattern 130. That is, the first work function adjustment layer 220 is exposed, and the second work function adjustment layer 320 is covered by the mask pattern 130 and the photoresist pattern 140. The mask pattern 130 and the photoresist pattern 140, which are formed on the second work function adjustment layer 320, may be used as the etching mask in a subsequent process.

Furthermore, the mask layer buried in the first trench 230 may be removed by dry etching. The dry etching may be reactive ion etching (RIE).

As an example of the dry etching process for forming the mask pattern 130, the mask layer buried in the first trench 230 is etched and removed with an etching gas mixture comprising oxygen and chlorine. Furthermore, the etching gas may additionally include helium.

In an example of the method of fabricating a semiconductor device according to an embodiment of the present inventive concept, the fraction (% by volume) of chlorine in the etching gas mixture may be greater than the fraction (% by volume) of oxygen. For example, the ratio of the fraction of chlorine to the fraction of oxygen may be between about 1.1 and about 7.

Furthermore, the fraction (% by volume) of helium may be greater than the fraction (% by volume) of oxygen and may be greater than the fraction (% by volume) of chlorine in the etching gas mixture. In addition, the amount (% by volume) of helium may be greater the combined amounts (% by volume) of oxygen and chlorine.

When removing the mask layer from the first trench 230 through a reactive ion etching process, a bias may be applied to the substrate 100. For example, the bias applied to the substrate 100 may be between 10V and 300V, but the embodiment is not limited thereto. Furthermore, in the reactive ion etching process, the power for generating plasma may be between 50 W and 600 W, but the embodiment is not limited thereto.

As another example of the dry etching process for forming the mask pattern 130, the mask layer buried in the first trench 230 is etched and removed by using an etching gas mixture including nitrogen and hydrogen.

Figure 7:
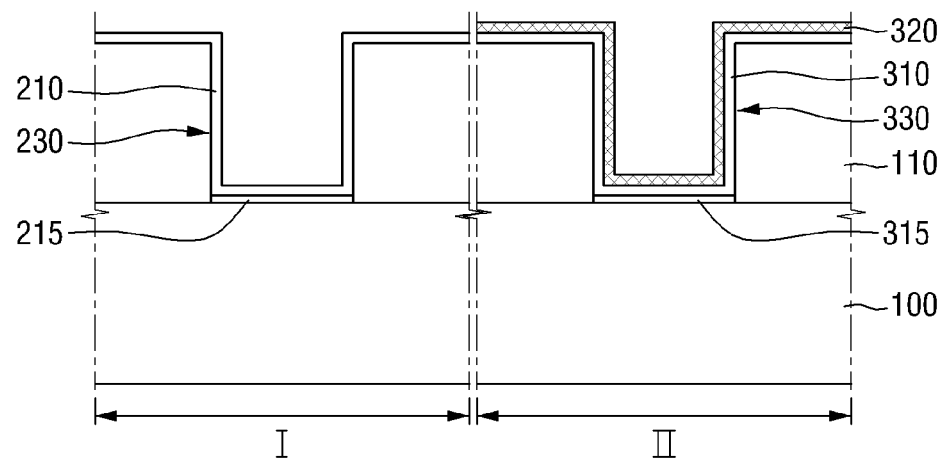

Referring to FIG. 7, the first work function adjustment layer 220 is removed by using the mask pattern 130 as the mask. As a result, the first dielectric layer 210 may be exposed.

Specifically, the first work function adjustment layer 220, which is formed along the sides and the bottom of the first trench 230, is removed by using the stacked layer composed of the mask pattern 130 and the photoresist pattern 140 as the etching mask.

The first work function adjustment layer 220 may be removed by wet etching. The etchant, which is used in the wet etching, may comprise hydrogen peroxide ($H_2O_2$), but the embodiment is not limited thereto. In the process of removing the first work function adjustment layer 220, the wet etching may be used in order to minimize damage to the first dielectric layer 210 to be exposed.

Subsequently, the mask pattern 130 and the photoresist pattern 140, which are formed on the second work function adjustment layer 320, are removed. The second work function adjustment layer 320 is exposed by removing the stacked layer composed of the mask pattern 130 and the photoresist pattern 140.

For example, the mask pattern 130 and the photoresist pattern 140 may be ashed and stripped by a gas mixture comprising hydrogen and nitrogen.

The second dielectric layer 310 is exposed by removing the mask pattern and the photoresist pattern 140 from atop the upper surface of the inter-metal dielectric layer 110 on the second region II. Hence, the second dielectric layer 310 and the second work function adjustment layer 320 extend conformally along the sides of the second trench 330 and over the second interface layer 315. On the other hand, the first dielectric layer 210 remains exposed on the upper surface of the inter-metal dielectric layer 110 on the first region I. Hence, the first dielectric layer 210 extends conformally along the sides of the first trench 230, and over the first interface layer 215.

Figure 8:
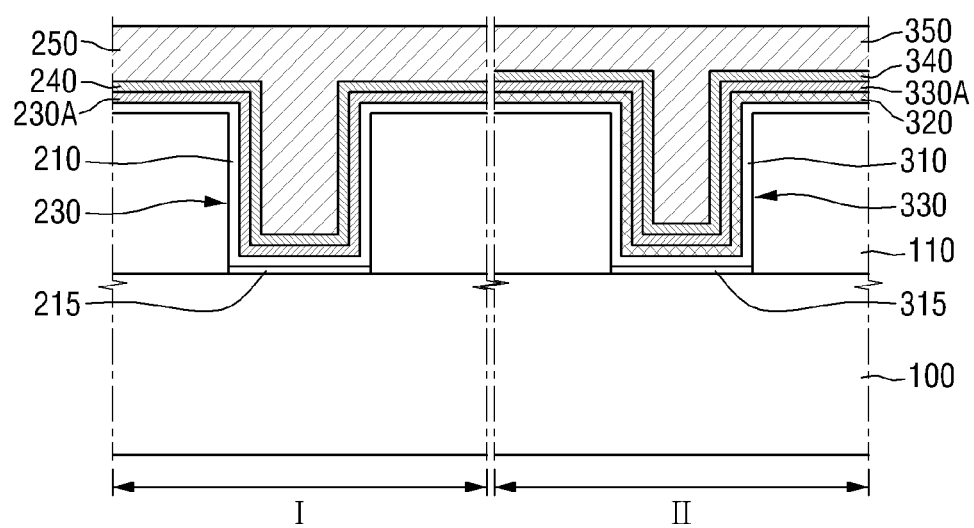

Referring to FIG. 8, first capping metal layer 230A is formed on the first dielectric layer 210 on the first region I, and second capping metal layer 330A is formed on the second work function adjustment layer 320 on the second region II. The first capping metal layer 230A and the second capping metal layer 330A may be a TiN layer.

As illustrated in FIG. 4, the first lower conductive layer 222 on the first dielectric layer 210 is removed, and thus the first dielectric layer 210 on the first region I and the first capping metal layer 230A may contact each other.

Subsequently, the third work function adjustment layer 240 is formed on the first capping metal layer 230A on the first region, and the fourth work function adjustment layer 340 is formed on the second capping metal layer 330A on the second region II. In an example of this embodiment, the third work function adjustment layer 240 and the fourth work function adjustment layer 340 may both be an n-type work function adjustment layer. For example, the third work function adjustment layer 240 and the fourth work function adjustment layer 340 may be formed of a material selected from a group consisting of TiAl, TiAlN, TaC, TiC, and HfSi. For example, the third work function adjustment layer 240 and the fourth work function adjustment layer 340 may each be a TiAl layer.

Subsequently, the first conductive layer 250 may be formed on the third work function adjustment layer 240 on the first region I, and the second conductive layer 350 may be formed on the fourth work function adjustment layer 340 on the second region II. For example, the first conductive layer 250 and the second conductive layer 350 may be formed of Al and W, but the embodiment is not limited thereto.

Though not illustrated, a material layer may be formed on the first conductive layer 250 and the second conductive layer 260 for enhancing the adhesive property between the third work function adjustment layer 240 and the first conductive layer 250, and between the fourth work function adjustment layer 340 and the second conductive layer 260. Such a material layer may comprise at least one of TiN and Ti.

Figure 9:
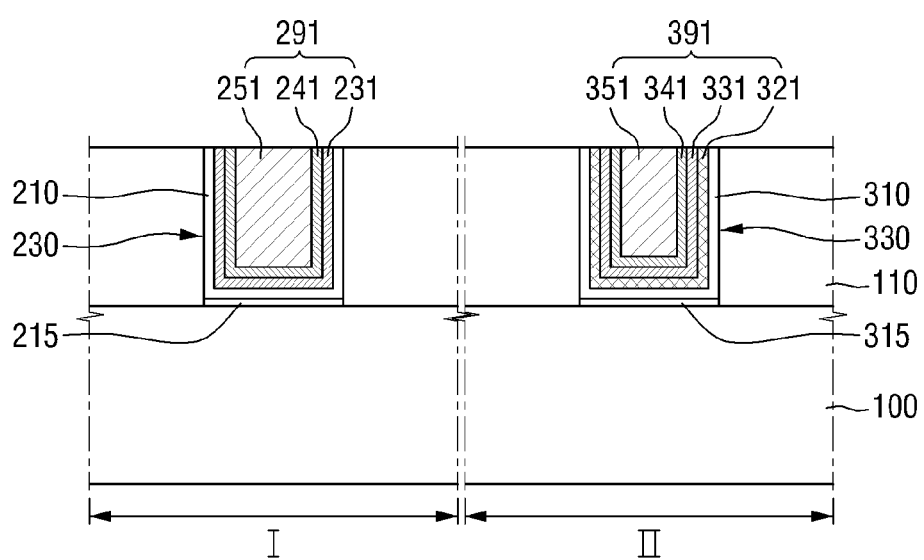

Referring to FIG. 9, the first metal gate structure 291 is formed within the first trench 230, and the second metal gate structure 391 is formed within the second trench 330 by performing a planarization process.

As described above, the first metal gate structure 291 may comprise a first capping metal pattern 231 which is formed to directly on, i.e., in contact with, the first dielectric layer 210, a third work function adjustment pattern 241 which is formed on the first capping metal pattern 231, and a conductive pattern 251 which is formed on the third work function adjustment pattern 241, within the first trench 230. The first dielectric layer 210, the first capping metal pattern 231, and the third work function adjustment pattern 241 may be formed along the sides and bottom of the first trench 230.

Furthermore, the second metal gate structure 391 may comprise a second work function adjustment pattern 321 which is formed on the second dielectric layer 310, a second capping metal pattern 331 which is formed on the second work function adjustment pattern 321 and is formed of the same material as that of the first capping metal pattern 231, a fourth work function adjustment pattern 341 which is formed on the second capping metal pattern 331 and is formed of the same material as that of the third work function adjustment pattern 241, and a second conductive pattern 351 which is formed on the fourth work function adjustment pattern 341, within the second trench 330. The second dielectric layer 310, the second capping metal pattern 331, and the fourth work function adjustment pattern 341 may be formed along the sides and the bottom of the second trench 330.

Furthermore, the first capping metal pattern 231 and the second capping metal pattern 331 may be constituted by a TiN layer, and the second work function adjustment pattern 321 may be constituted by a TiN layer. In such a case, the sum of the thickness of TiN layer of the first metal gate structure 291 (i.e., the thickness of the first capping metal pattern 231) and the thickness of TiN layer of the second metal gate structure 391 (i.e., the sum of the thicknesses of the second work function adjustment pattern 321 and the second capping metal pattern 331 which contact each other) may be different from each other. The sum of the thicknesses of the second work function adjustment pattern 321 and the second capping metal pattern 331 may be greater than the thickness of the first capping metal pattern 231.

Furthermore, the thickness of the second work function adjustment pattern 321 may be different from the thickness of the first capping metal pattern 231 and the thickness of the second capping metal pattern 331. The second work function adjustment pattern 321 may be thicker than the first capping metal pattern 231 and thicker than the second capping metal pattern 331. The first capping metal pattern 231 may have the same thickness as the second capping metal pattern 331.

In the first embodiment of the method of fabricating the semiconductor device according to the present inventive concept, after performing heat treatment, the first lower conductive layer 222 and the second lower conductive layer 322 as well as the first capping layer 224 and the second capping layer 324 are removed. In this way, the uniformity of the layers formed later as stacked on the structure may be ensured.

A second embodiment of a method of fabricating a semiconductor device according to the present inventive concept will be described with reference to FIGS. 10 to 14. FIGS. 10 to 14 illustrate intermediate stages in the method and thus, the description will focus on the differences with the first embodiment for the sake of brevity.

As was described with reference to FIGS. 1 to 4, an inter-metal dielectric layer 110, which is formed on the substrate 100, includes a first trench 230 which is formed on the first region I, and a second trench 330 which is formed on the second region II. The first interface layer 215 is formed along the bottom of the first trench 230, and the second interface layer 315 is formed along the bottom of the second trench 330. The first dielectric layer 210 is formed along the sides and bottom of the first trench 230, and the second dielectric layer 310 is formed along the sides and bottom of the second trench 330.

Figure 10:
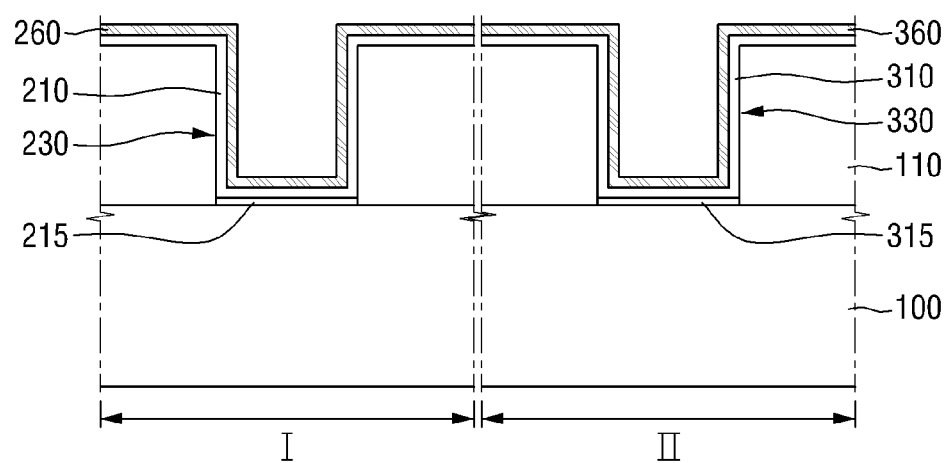
FIGS. 10, 11, 12, 13 and 14 are each a cross-sectional view of a semiconductor device during the course of its manufacture, for use in illustrating a second embodiment of a method of fabricating a semiconductor device according to present inventive concept.

Subsequently, and referring to FIG. 10, the first etch stopping layer 260 is formed on the first dielectric layer 210 and the second etch stopping layer 360 on the second dielectric layer 310. The first etch stopping layer 260 may be formed along the sides and the bottom of the first trench 230, and the second etch stopping layer 260 may be formed along the sides and the bottom of the second trench 330.

The first lower conductive layer 222 is removed, and thus the first etch stopping layer 260 may be formed to contact the first dielectric layer 210. The first etch stopping layer 260 and the second etch stopping layer 360 may both be a TaN layer, but the embodiment is not limited thereto.

Figure 11:
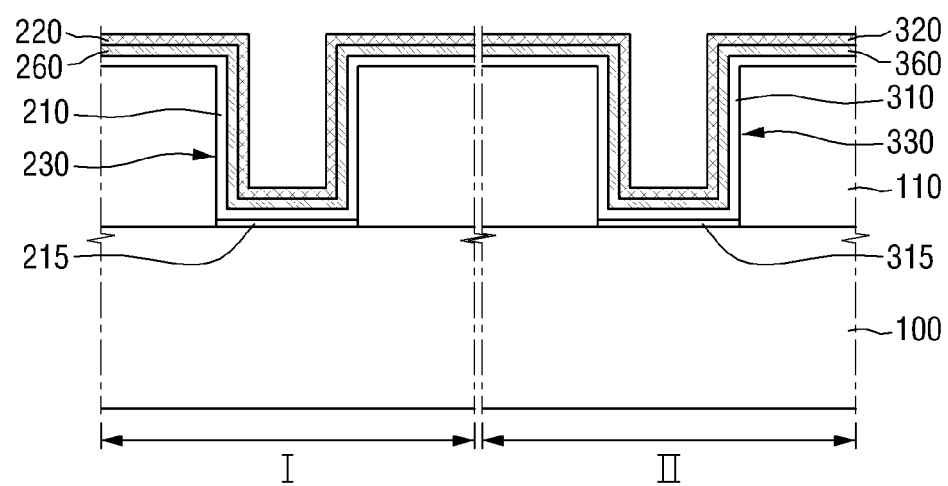

Referring to FIG. 11, the first work function adjustment layer 220 and the second work function adjustment layer 320 are respectively formed on the first etch stopping layer 260 and the second etch stopping layer 360. The first work function adjustment layer 220 and the second work function adjustment layer 320 may be a p-type work function adjustment layer.

Figure 12:
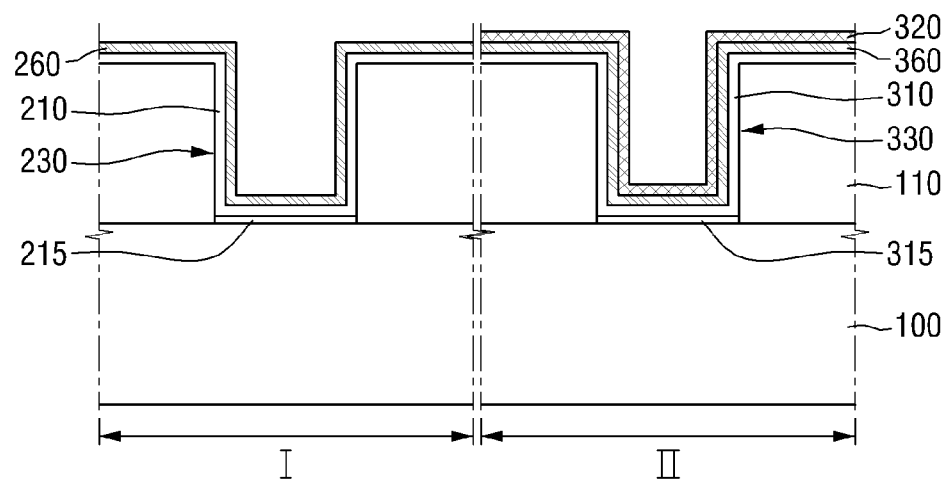

Referring to FIG. 12, the first work function adjustment layer 220 on the first region I is removed, and the second work function adjustment layer 320 on the second region II is not removed. As a result, the first etch stopping layer 260 may be exposed.

Figure 13:
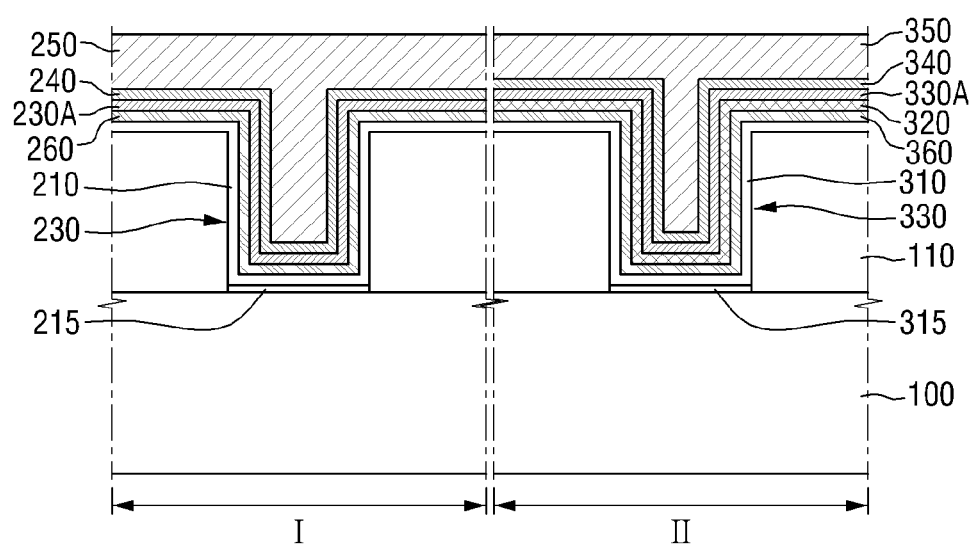

Referring to FIG. 13, the first capping metal layer 230A is formed on the first etch stopping layer 260 on the first region I, and the second capping metal layer 330A is formed on the second work function adjustment layer 320 on the second region II.

The third work function adjustment layer 240 is formed on the first capping metal layer 230A on the first region I, and the fourth work function adjustment layer 340 is formed on the second capping metal layer 330A on the second region II. Here, the third work function adjustment layer 240 and the fourth work function adjustment layer 340 may both be an n-type work function adjustment layer.

A first conductive layer 250 may be formed on the third work function adjustment layer 240 on the first region I, and the second conductive layer 350 may be formed on the fourth work function adjustment layer 340 on the second region II.

Figure 14:
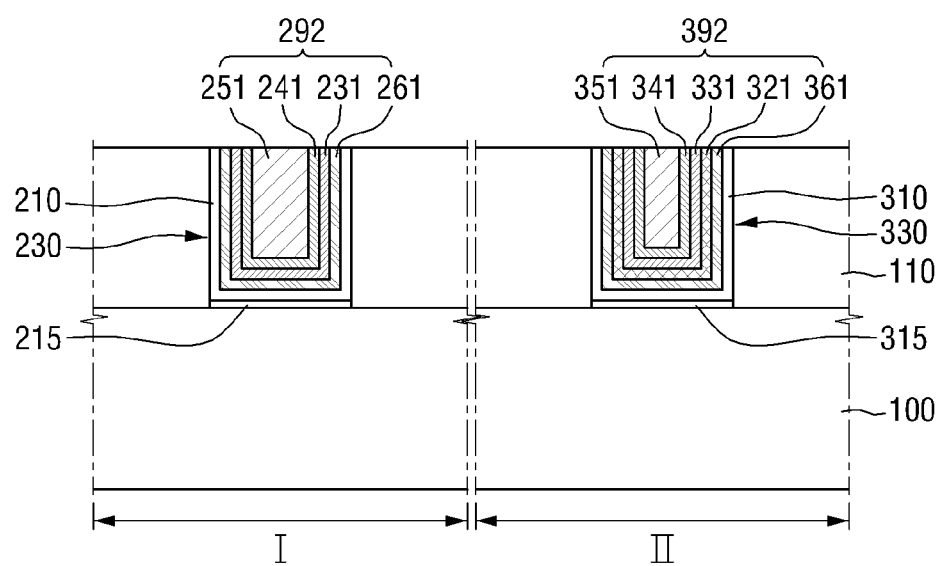

Referring to FIG. 14, first metal gate structure 292 within the first trench 230, and second metal gate structure 392 within the second trench 330 may be formed by performing a planarization process.

The first metal gate structure 292 may include the first etch stopping pattern 261 which is formed directly on, i.e., is formed in contact with, the first dielectric layer 210, the first capping metal pattern 231 which is formed on the first etch stopping pattern 261, the third work function adjustment pattern 241 which is formed on the first capping metal pattern 231, and the first conductive pattern 251 which is formed on the third work function adjustment pattern 241, within the first trench 230. The etch stopping pattern 261, the third capping metal pattern 231, and the third work function adjustment pattern 241 may be formed along the sides and the bottom of the first trench 230.

Furthermore, the second metal gate structure 392 may include a second etch stopping pattern 361 which is formed on the second dielectric layer 310, the second work function adjustment pattern 321 which is formed on the second etch stopping layer 361, the second capping metal pattern 331 which is formed on the second work function adjustment pattern 321 and is formed of the same material as the first capping metal pattern 231, the fourth work function adjustment pattern 341 which is formed on the second capping metal pattern 331 and is formed of the same material as the third work function adjustment pattern 241, and the second conductive pattern 351 which is formed on the fourth work function adjustment pattern 341, within the second trench 330. The second etch stopping pattern 361, the second work function adjustment pattern 321, the second capping metal pattern 331, and the fourth work function adjustment pattern 341 may be formed along the sides and the bottom of the second trench 330.

A third embodiment of a method of fabricating a semiconductor device according to the present inventive concept will be described with reference to FIG. 15.

Figure 15:
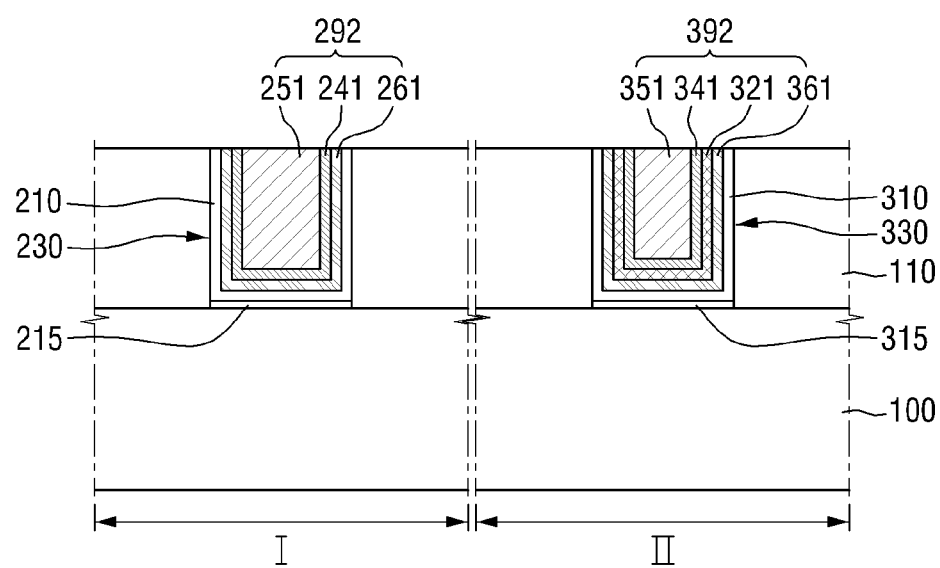
FIG. 15 is each a cross-sectional view of a semiconductor device during the course of its manufacture, for use in illustrating a third embodiment of a method of a fabricating a semiconductor device according to the present inventive concept.

FIG. 15 illustrates an intermediate operation in the method. Therefore, the description will focus on the differences with the second embodiment for the sake of brevity.

Referring to FIG. 15, the method is similar to the second embodiment except in that the first capping metal pattern 231 and the second capping metal pattern 331 are not formed.

That is, the first metal gate structure 291 does not include a first capping metal pattern between the first etch stopping pattern 261 and the third work function adjustment pattern 241. Furthermore, the second metal gate structure 391 does not include a second capping metal pattern between the second work function adjustment pattern 321 and the fourth work function adjustment pattern 341. Hence, the third work function adjustment pattern 241 is formed directly on, i.e., in contact with, the first etch stopping pattern 261, and the fourth work function adjustment pattern 341 is formed directly on, i.e., in contact with, the second work function adjustment pattern 321.

A fourth embodiment of a method of fabricating a semiconductor device according to the present inventive concept will be described with reference to FIGS. 16 to 19.

FIGS. 16 to 19 illustrate intermediate operations in the method.

Figure 16:
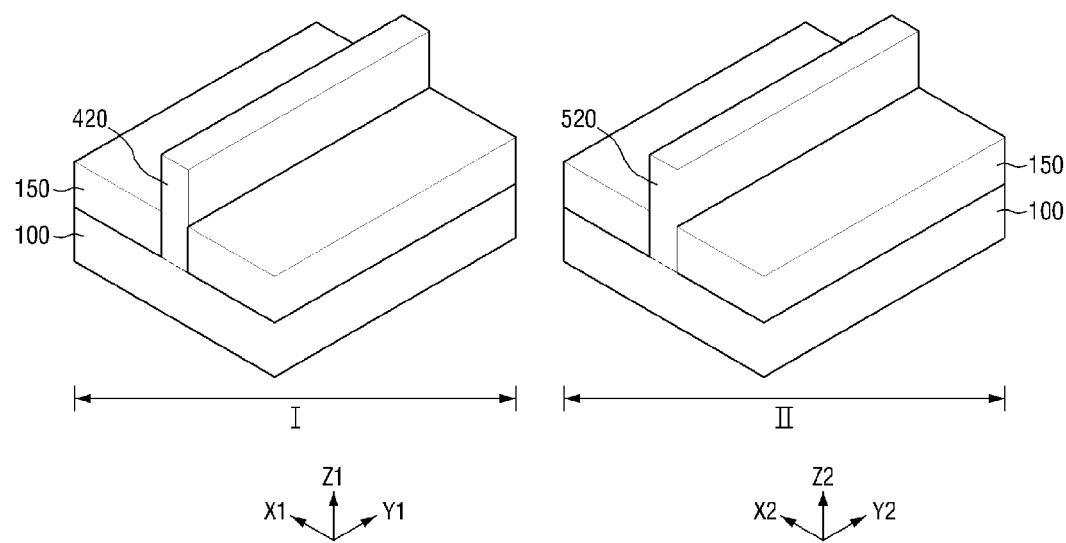
FIGS. 16 to 19 illustrate intermediate operations of a fourth embodiment of a method of fabricating a semiconductor device according to the present inventive concept, with FIGS. 16, 17 and 18 each being a perspective view and FIG. 19 being a cross-sectional view taken along lines A-A and B-B of FIG. 18.

Referring to FIG. 16, a first fin-type active pattern 420 and a second fin-type active pattern 520 are formed. The first fin-type active pattern 420 is formed in a first region I, and the second fin-type active pattern 520 is formed in a second region II.

The first fin-type active pattern 420 and the second fin-type active pattern 520 may extend longitudinally along second directions (Y1, Y2), respectively. The first fin-type active pattern 420 and the second fin-type active pattern 520 may be part of a substrate 100 or may comprise an epitaxial layer which has been grown from the substrate 100. A device separation layer 150 may cover the side surfaces of the first fin-type active pattern 420 and the second fin-type active pattern 520.

The first fin-type active pattern 420 and the second fin-type active pattern 520 may comprise semiconductor materials. For example, the first fin-type active pattern 420 and the second fin-type active pattern 520 may consist of semiconductor materials such as silicon or germanium. Alternatively, the first fin-type active pattern 420 and the second fin-type active pattern 520 may comprise a semiconductor compound, e.g., a group IV-IV semiconductor compound or a group III-V semiconductor compound. Specifically, in the case of the group IV-IV semiconductor compound, the first fin-type active pattern 420 and the second fin-type active pattern 520 may be a binary compound or ternary compound comprising at least two of C, Si, Ge, and Sn, or a compound which is generated by doping the group IV semiconductor material of the binary compound or ternary compound. In the case of the group III-V semiconductor compound, the first fin-type active pattern 420 and the second fin-type active pattern 520 may be a binary compound, ternary compound, or quaternary compound which is formed of at least one of Al, Ga, and In which are group III elements and one of P, As, and Sb which are group V elements.

Figure 17:
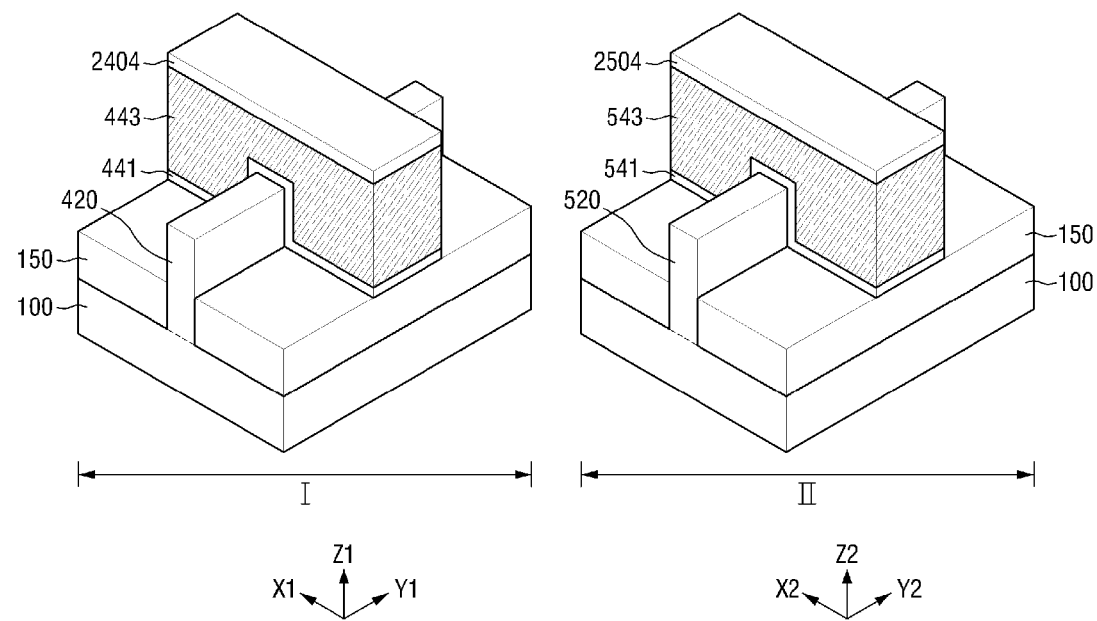

Referring to FIG. 17, a first dummy gate 443, which extends in a first direction X1 across the first fin-type active pattern 420, and a second dummy gate 543, which extends in a first direction X2 across the second fin-type active pattern 520, may be formed by performing an etching process using first hard mask pattern 2404 and second hard mask pattern 2504 as etch masks.

A first dummy gate dielectric layer 441 is formed on the first fin-type active pattern 420 before the first dummy gate 443 is formed so as to be interposed between the first fin-type active pattern 420 and the first dummy gate 443. Likewise, a second dummy gate dielectric layer 541 is formed on the second fin-type active pattern 520 before the second fin-type active pattern 520 is formed so as to be interposed between the second fin-type active pattern 520 and the second dummy gate 543.

The first dummy gate dielectric layer 441 and the second dummy gate dielectric layer 541 may comprise $SiO_2$, SiON, or a combination thereof. The first dummy gate 443 and the second dummy gate 543 may comprise poly Si, a-Si, or a combination thereof.

Figure 18:
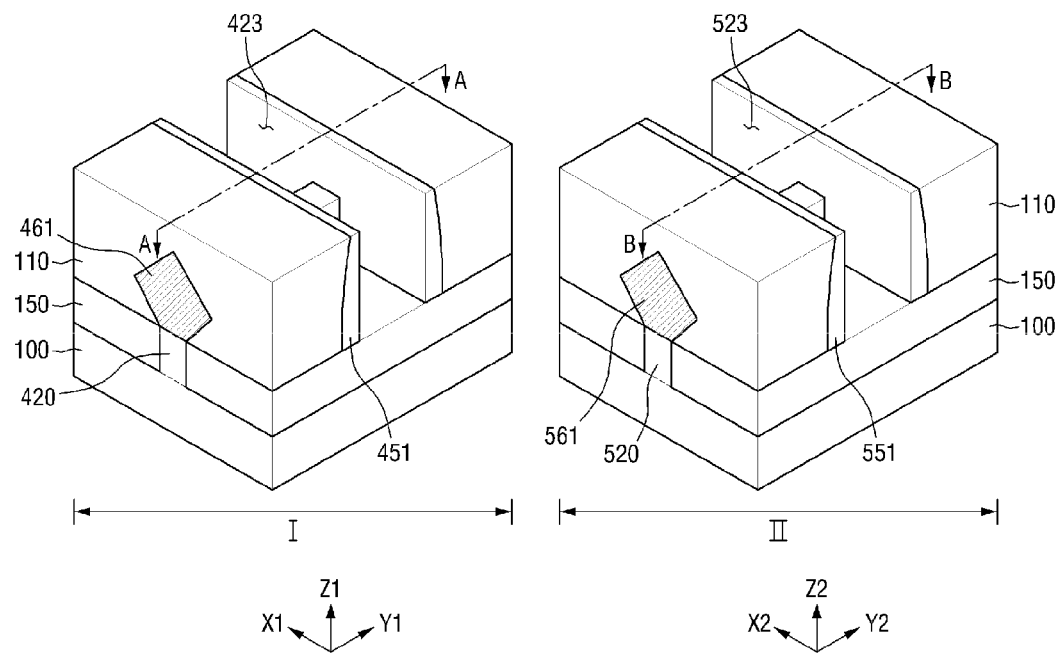

Referring to FIG. 18, a first spacer 451 and a second spacer 551 are respectively formed on the sides of the first dummy gate 443 and the second dummy gate 543. Then, respective recesses are formed by removing those parts of the first fin-type active pattern 420 and the second fin-type active pattern 520 which are not covered by the first dummy gate 443 and the second dummy gate 543.

Subsequently, a first source/drain 461 and a second source/drain 561 are respectively formed at both sides of the first dummy gate 443 and the second dummy gate 543.

Subsequently, an inter-metal dielectric layer 110, which covers (the remnant of) the first fin-type active pattern 420, the first dummy gate 443, the first source/drain 461, (the remnant of) the second fin-type active pattern 520, the second dummy gate 543, and the second source/drain 561, is formed.

Subsequently, through the planarization process, the upper surfaces of the first dummy gate 443 and the second dummy gate 543 are exposed.

Subsequently, a third trench 423, which crosses the first fin-type active pattern 420, is formed by removing the first dummy gate 443 and the first dummy gate dielectric layer 441. Furthermore, a fourth trench 523, which crosses the second fin-type active pattern 520, is formed by removing the second dummy gate 543 and the second dummy gate dielectric layer 541.

Figure 19:
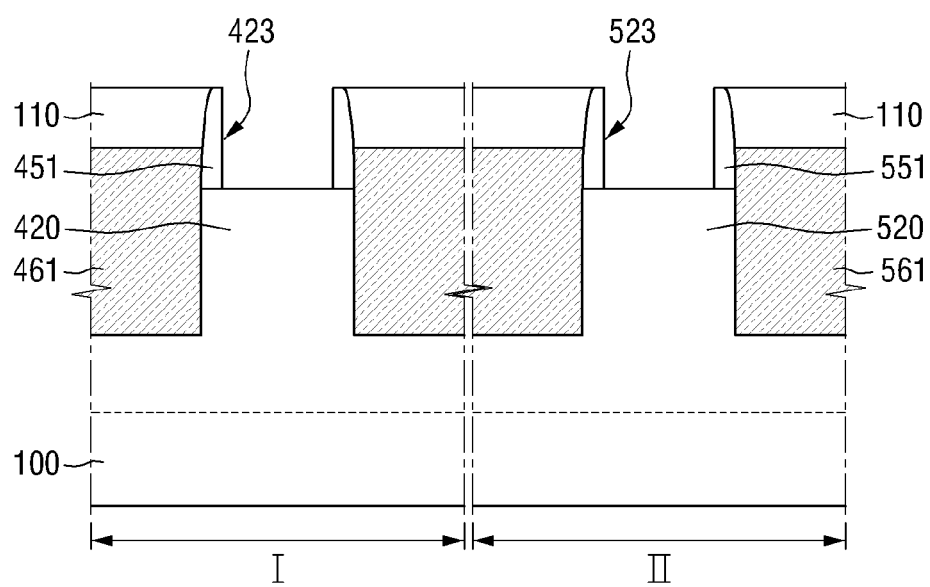

In FIG. 19, the fabrication process carried out after the third trench 423 and the fourth trench 523 have been formed is substantially the same as the fabrication which has been described with reference to FIGS. 4 to 9, and thus will not be repeated here for the sake of brevity.

Figure 20:
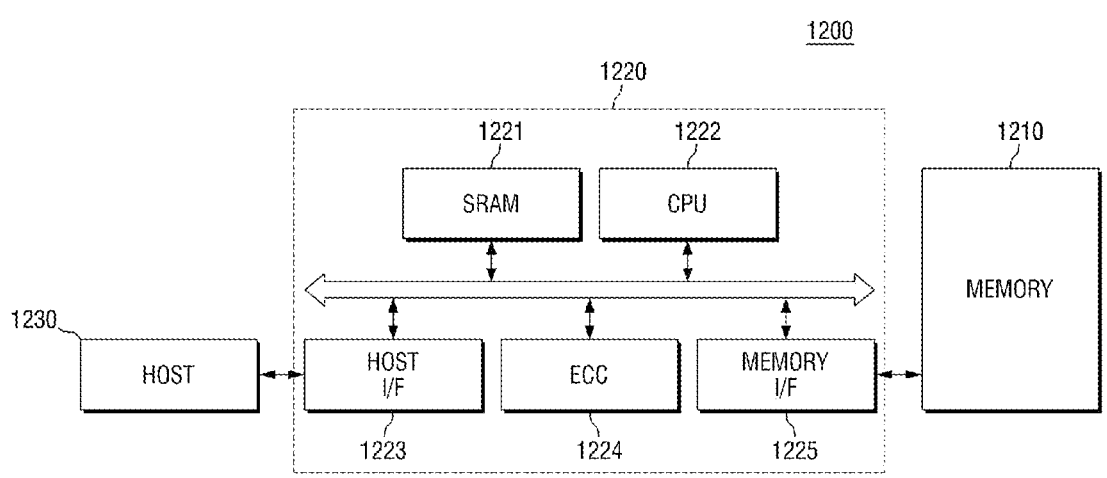
FIG. 20 is a block diagram of a memory card including a semiconductor device which has been fabricated according to a method according to the present inventive concept as connected to a host.

FIG. 20 is a block diagram of an information processing system 1200 including a semiconductor device which has been fabricated by a method according to the present inventive concept. The information processing system 1200 may include a memory controller 1220 and memory 1210 embodied as a memory card.

Referring to FIG. 20, the memory 1210 has a semiconductor device which has been fabricated according to the present inventive concept. The memory controller 1220 controls a data exchange between a host 1230 and the memory 1210. The memory controller 1220 may include a SRAM 1221 as an operation memory of a central processing unit (CPU) 1222 of the memory controller 1220, a host interface 1223 providing a protocol for exchanging data after the host 1230 is connected to the memory controller 1220, error correction code 1224 for detecting and correcting errors of data which has been read from the memory 1210, and a memory interface 1225 providing an interface with the memory 1210. The CPU 1222 may perform overall control related to the data exchange of the memory controller 1220.

Figure 21:
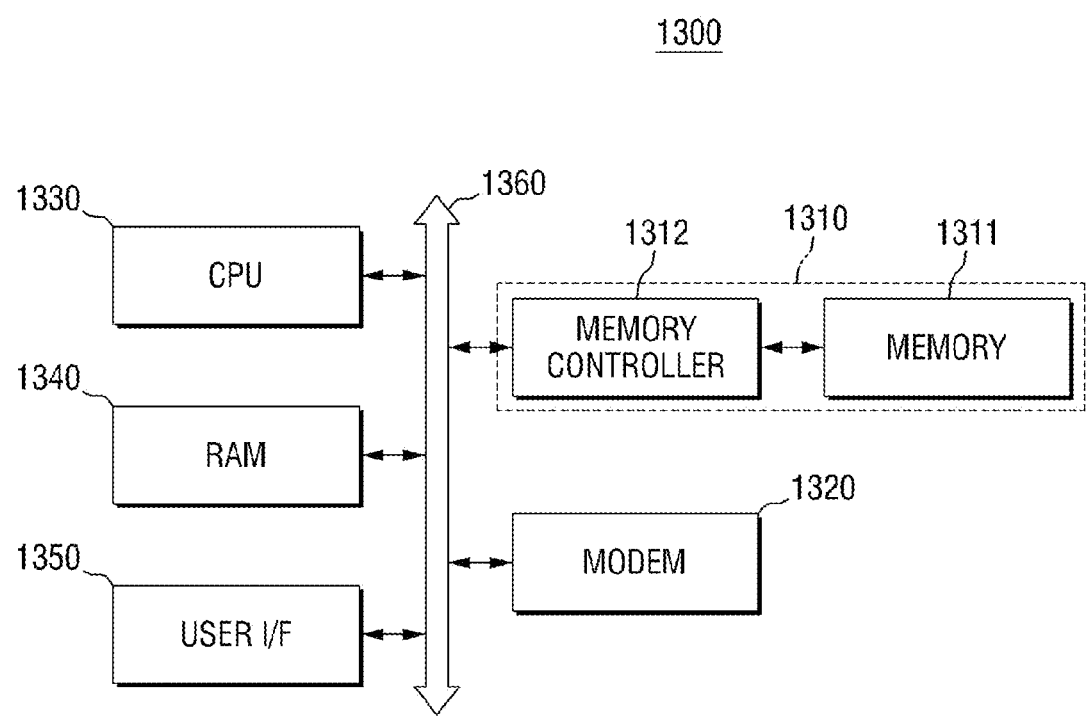
FIG. 21 is a block diagram of an information processing system including a semiconductor device which has been fabricated according the present inventive concept.

FIG. 21 is a block diagram of another information processing system having a semiconductor device fabricated according to the present inventive concept.

Referring to FIG. 21, the information processing system 1300 may include a memory system 1310 including a semiconductor device which has been fabricated according to the present inventive concept. In addition to the memory system 1310, the information processing system 1300 may also include a modem 1320, a central processing unit (CPU) 1330, a RAM 1340, and a user interface 1350 electrically connected to a system bus 1360. The memory system 1310 may include a memory 1311 and a memory controller 1312 and may have substantially the same configuration as those illustrated in and described with reference to FIG. 18 and hence, may be embodied as a memory card. The data which is processed by the CPU 1330 or data which is received from an external device may be stored in the memory system 1310. The information processing system 1300 may comprise or be employed by a memory card, an SSD, a camera image sensor, or various other types of chipsets. For example, the memory system 1310 may be embodied as an SSD and in this case, the information processing system 1300 may stably and reliably process mass amounts of data.

Figure 22:
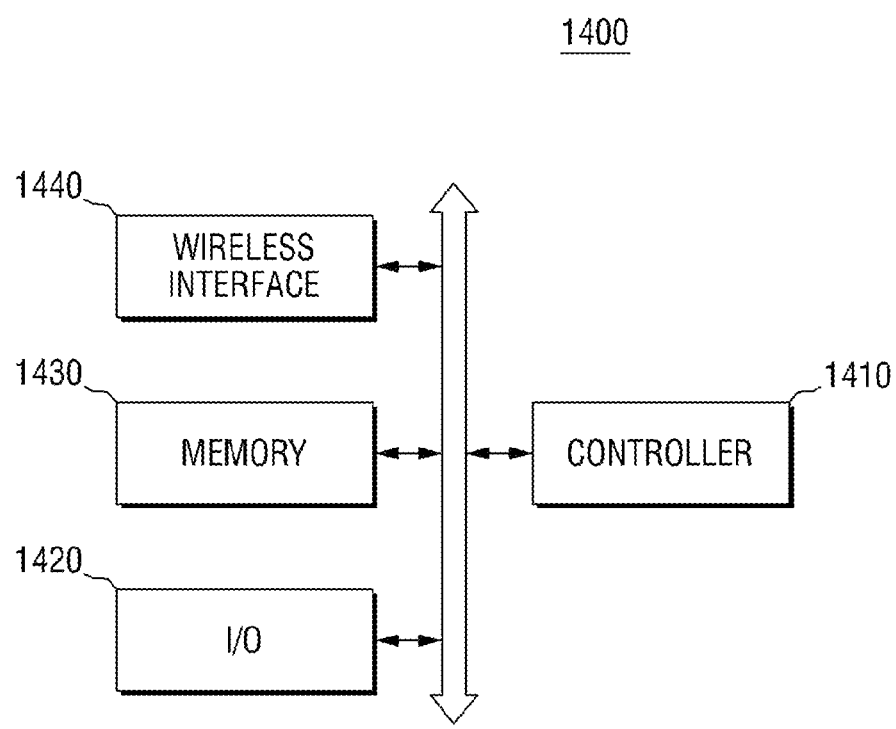
FIG. 22 is a block diagram of an electronic device including a semiconductor device which has been fabricated according to the present inventive concept.

FIG. 22 is a block diagram of an electronic device 400 including a semiconductor device which has been fabricated according to the present inventive concept.

Referring to FIG. 22, the electronic device 1400 may be used in wireless communication devices (e.g., a PDA, a notebook computer, a portable computer, a web tablet, a wireless phone, and/or a wireless digital music player) or any device for that matter which facilitates an exchange of information in a wireless communication environment.

The electronic device 1400 may include a controller 1410, an input/output device 1420, a memory 1430, and a wireless interface 1440. In this example, the memory 1430 may include a semiconductor device which has been fabricated according to the present inventive concept. The controller 1410 may include a microprocessor, a digital signal process, or any other similar processor. The memory 1430 may be used in storing a command (or user data) which is processed by the controller 1410. The wireless interface 1440 may be used in exchanging data through a wireless data network. The wireless interface 1440 may include an antenna and/or wireless transceiver. The electronic device 1400 may use a third generation communication system protocol such as CDMA, GSM, NADC, E-TDMA, WCDMA, or CDMA2000.

Although preferred embodiments of the present inventive concept have been described for illustrative purposes, those skilled in the art will appreciate that various modifications, additions and substitutions are possible, without departing from the scope and spirit of the inventive concept as set forth in the accompanying claims.

What is claimed is:

1. A method of fabricating a semiconductor device, the method comprising:
    forming an inter-metal dielectric layer having a first trench and a second trench which are spaced from each other, on a substrate, whereby each of the trenches has sides and a bottom;
    forming a first dielectric layer along the sides and bottom of the first trench;
    forming a second dielectric layer along the sides and bottom of the second trench;
    forming a first lower conductive layer and a second lower conductive layer respectively on the first dielectric layer and the second dielectric layer;
    forming a first capping layer and a second capping layer respectively on the first lower conductive layer and the second lower conductive layer;
    performing a heat treatment after the first and second capping layers have been formed;
    removing the first and second capping layers and the first and second lower conductive layers after performing the heat treatment; and
    forming first and second metal gate structures respectively on the first and second dielectric layers,
    wherein the forming of the first and second lower conductive layers comprises forming a TiN layer on the first and second dielectric layers.

2. The method of claim 1, wherein the forming of the first and second capping layers comprises forming a silicon layer on the first and second lower conductive layers.

3. The method of claim 1, wherein the forming of the first metal gate structure comprises:
    forming a first capping metal pattern directly on the first dielectric layer; and
    forming a first work function adjustment pattern on the first capping metal pattern.

4. The method of claim 3, wherein the forming of the second metal gate structure comprises:
    forming a second work function adjustment pattern on the second dielectric layer;
    forming a second capping metal pattern, of the same material as the material of the first capping metal pattern, on the second work function adjustment pattern; and
    forming a third work function adjustment pattern, of the same material as the material of the first work function adjustment pattern, on the second capping metal pattern.

5. The method of claim 1, wherein the forming of the first metal gate structure comprises:
    forming a first etch stopping pattern directly on the first dielectric layer; and
    forming a first work function adjustment pattern on the first etch stopping pattern.

6. The method of claim 5, wherein the forming of the second metal gate structure comprises:
    forming a second etch stopping pattern, of the same material as the material of the first etch stopping pattern, on the second dielectric layer;
    forming a second work function adjustment layer on the second etch stopping pattern; and
    forming a third work function adjustment pattern, of the same material as the material of the first work function adjustment pattern, on the second work function adjustment pattern.

7. The method of claim 6, wherein the forming of the first metal gate structure comprises:
    forming a first capping metal pattern on the first etch stopping pattern and before the first work function adjustment pattern is formed, whereby the first capping metal pattern is interposed between the first etch stopping pattern and the first work function adjustment pattern, and
    wherein the forming of the second metal gate structure comprises:
    forming a second capping metal pattern, of the same material as the material of the first capping metal pattern, on the second work function adjustment pattern and before the third work function adjustment pattern is formed, whereby the second capping metal pattern is interposed between the second work function adjustment pattern and the third work function adjustment.

8. The method of claim 1, wherein the forming of the first dielectric layer along the sides and bottom of the first trench is performed after the first trench has been formed.

9. The method of claim 1, wherein the forming of the second dielectric layer along the sides and bottom of the second trench is performed after the second trench has been formed.

10. A method of fabricating a semiconductor device, the method comprising:
    forming an inter-metal dielectric layer including a trench on a substrate, whereby the trench has sides and a bottom;
    after the trench has been formed, forming a dielectric layer along the sides and bottom of the trench;
    forming a lower conductive layer and a capping silicon layer sequentially on the dielectric layer;
    performing a heat treatment after the capping silicon layer has been formed;
    removing the lower conductive layer and the capping silicon layer after performing the heat treatment; and
    forming a metal gate structure.

11. The method of claim 10, wherein the forming of the metal gate structure comprises:
    forming a P-type work function adjustment pattern on the dielectric layer;
    forming a capping metal pattern on the P-type work function adjustment pattern; and
    forming an N-type work function adjustment pattern on the capping metal pattern.

12. The method of claim 11, wherein the forming of the metal gate structure further comprises forming an etch stopping pattern, of material of a composition different from that of the material of the lower conductive layer, directly on the dielectric layer.

13. The method of claim 12, wherein the forming of the lower conductive layer comprises forming a TiN layer on the capping silicon layer,
the forming of the capping metal pattern comprises forming a TiN layer on the P-type work function adjustment pattern, and
the forming of the etch stopping pattern comprises forming a TaN layer directly on the dielectric layer.

14. The method of claim 10, wherein the metal gate structure includes a P-type work function adjustment pattern and an N-type work function adjustment pattern on the dielectric layer.

15. A method of fabricating a semiconductor device, the method comprising:
forming a structure that includes a semiconductor substrate, an interlayer dielectric layer on the substrate, and an interface layer of a silicon oxide on the semiconductor substrate, and wherein the structure has at least one trench passing through the interlayer dielectric layer, whereby each said at least one trench has sides and a bottom, and the interface layer is disposed on the semiconductor substrate at the bottom of the at least one trench;
subsequently forming a high-k dielectric layer conformally on the structure such that the high-k dielectric layer extends along surfaces which define the sides of each said at least one trench and along the interface layer;
forming a conductive layer conformally on the high-k dielectric layer such that the conductive layer also extends along surfaces which define the sides of each said at least one trench and along the interface layer;
covering the conductive layer and the interface layer in the at least one trench by forming capping material on the conductive layer;
heat treating the structure after the capping material has been formed;
subsequently removing the capping material and the conductive layer; and
subsequently forming at least one work function adjustment pattern, and a metal gate electrode in each said at least one trench.

16. The method of claim 15, wherein the forming of the capping material comprises forming at least one of a layer of amorphous silicon and a layer of poly silicon on the conductive layer.

17. The method of claim 16, wherein the forming of the conductive layer comprises forming a layer of TiN on the capping material.

18. The method of claim 15, further comprising forming an etching stop layer on the conductive layer, and
wherein the at least one structure is formed so as to have a first trench passing through the interlayer dielectric layer on a first region of the substrate and a second trench passing through the interlayer dielectric layer on a second region of the substrate, and
the forming of the at least one work adjustment layer comprises forming a work adjustment layer on the etching stop layer in the first and second trenches,
selectively etching the work adjustment layer to remove the work adjustment layer from the first trench, and leave a remnant of the work adjustment layer in the second trench, and
subsequently forming another work adjustment layer on the structure including in the first trench.

19. The method of claim 15, wherein the forming of the structure comprises:
forming a fin of semiconductor material,
forming at least one dummy pattern on the fin, and wherein the dummy pattern extends across the fin,
forming a sidewall spacer on opposite sides of each said at least one dummy pattern,
subsequently forming the interlayer dielectric layer on the substrate such that each said at least one dummy pattern and the sidewall spacer on opposite sides thereof extend through the interlayer dielectric layer, and
subsequently removing said at least one dummy pattern and the sidewall spacer on opposite sides thereof.

* * * * *